United States Patent
Rhodes et al.

(10) Patent No.: US 9,978,944 B2
(45) Date of Patent: *May 22, 2018

(54) ORGANIC ELECTRONIC COMPOSITIONS AND DEVICE THEREOF

(71) Applicants: PROMERUS, LLC, Brecksville, OH (US); MERCK PATENT GMBH, Darmstadt (DE)

(72) Inventors: Larry F Rhodes, Brecksville, OH (US); Crystal D Cyrus, Brecksville, OH (US); Hugh A Burgoon, Brecksville, OH (US); Irina Afonina, Southampton (GB); Toby Cull, Romsey (GB)

(73) Assignees: PROMERUS, LLC, Brecksville, OH (US); MERCK PATENT GMBH (DE)

( * ) Notice: Subject to any disclaimer, the term of this patent is extended or adjusted under 35 U.S.C. 154(b) by 46 days.

This patent is subject to a terminal disclaimer.

(21) Appl. No.: 15/123,891

(22) PCT Filed: Feb. 13, 2015

(86) PCT No.: PCT/EP2015/000324
§ 371 (c)(1),
(2) Date: Sep. 6, 2016

(87) PCT Pub. No.: WO2015/135622
PCT Pub. Date: Sep. 17, 2015

(65) Prior Publication Data
US 2017/0025612 A1    Jan. 26, 2017

Related U.S. Application Data

(60) Provisional application No. 61/951,610, filed on Mar. 12, 2014.

(51) Int. Cl.
| | | |
|---|---|---|
| C08F 32/00 | (2006.01) |
| H01L 51/00 | (2006.01) |
| H01L 51/05 | (2006.01) |
| C08F 232/08 | (2006.01) |
| C08F 232/00 | (2006.01) |

(52) U.S. Cl.
CPC ........ H01L 51/0034 (2013.01); C08F 232/08 (2013.01); H01L 51/0043 (2013.01); H01L 51/052 (2013.01); H01L 51/0541 (2013.01); H01L 51/0545 (2013.01); *C08F 232/00* (2013.01)

(58) Field of Classification Search
CPC ............. H01L 51/052; H01L 51/0034; H01L 51/0043; H01L 51/0541; H01L 51/0545; C08F 232/08; C08F 232/00
USPC ......................................................... 526/308
See application file for complete search history.

(56) References Cited

U.S. PATENT DOCUMENTS 9,425,417 B2 *   8/2016   Wierzchowiec ....  H01L 51/0032
2012/0056183 A1 *   3/2012   Mueller ................  C08F 232/00
257/57

FOREIGN PATENT DOCUMENTS

EP    2 676 978 A1    12/2013
EP    2 676 979 A1    12/2013

* cited by examiner

*Primary Examiner* — William K Cheung
(74) *Attorney, Agent, or Firm* — Balaram Gupta

(57) ABSTRACT

The present invention relates to organic electronic devices, and more specifically to organic field effect transistors, comprising a dielectric layer that comprises a polycycloolefinic polymer with an olefinic side chain.

20 Claims, 5 Drawing Sheets

ORGANIC ELECTRONIC COMPOSITIONS AND DEVICE THEREOF

CROSS REFERENCE TO RELATED APPLICATIONS

This application is a national phase application of PCT Application No. PCT/EP2015/000324, filed Feb. 13, 2015, and published as International Publication No. WO 2015/135622 A1 on Sep. 17, 2015, and which claims the benefit of U.S. Provisional Application No. 61/951,610, filed Mar. 12, 2014; both of which are incorporated herein by reference in their entirety.

TECHNICAL FIELD

The present invention relates to organic electronic compositions and devices thereof, specifically to organic dielectric compositions, and organic field effect transistors, comprising a dielectric layer that comprises a polycycloolefinic polymer with an olefinic side chain.

BACKGROUND

In recent years there has been growing interest in organic electronic (OE) devices, for example organic field effect transistors (OFET) for use in backplanes of display devices or logic capable circuits, and organic photovoltaic (OPV) devices. A conventional OFET has a gate electrode, a gate insulator layer made of a dielectric material (also referred to as "dielectric" or "gate dielectric"), source and drain electrodes, a semiconducting layer made of an organic semiconductor (OSC) material, and typically a passivation layer on top of the aforementioned layers to provide protection against environmental influence or against damage from subsequent device manufacturing steps.

For many top gate (TG) OFET applications fluorodielectrics like Cytop® or Hyflon® polymers are usually deposited from fluorosolvents, to provide a dielectric layer with inherent low permittivity ("low-k") and good orthogonality to a number of OSC material classes. However, the use of such dielectrics has a number of drawbacks, with the main issue being lack of cross-linking functionality which is difficult to incorporate without modifying the permittivity. In addition, the use of fluorinated solvents is not preferred for environmental and cost reasons.

It is desirable and advantageous to incorporate a reactive functionality into a dielectric which enables photo-patterning, as not only does this provide orthogonality to solvents employed in subsequent processing steps, but also allows for stack integration by the formation of via interconnects to the source and drain electrodes (S/D) below the dielectric and OSC layers, using photolithographic processes.

In developing a crosslinkable top gate dielectric, the bulk properties of the material used, such as low k and solubility must be retained. It is also important to consider the functional group employed in the cross-linking reaction to ensure quantities of polar or charged by-product species are not generated as side products. Such species will become incorporated into the cross-linked dielectric, causing unwanted effects such as an increase in the k value, or the introduction of charged species may dope the OSC layer resulting in decreased performance and stability.

Thus there is a need for solution processable dielectrics for the preparation of dielectric layers in OE devices, which have low permittivity, show good orthogonality to a number of OSC material classes, can be deposited from non-halogenated solvents, can be cross-linked to enable photo-patterning and stack integration by the formation of via interconnects to the S/D electrodes, and wherein the cross-linking reaction does not generate undesired polar or charged by-product species as side products.

In particular, it is desired to have a UV crosslinkable dielectric with a solubility profile orthogonal to the OSC polymer, a permittivity as low as possible to give the highest TFT performance, and a cross-linking functional group, and/or cross-linking agents, incorporated to allow via interconnect patterning. The dielectric should, in conjunction with the OSC polymer, give high mobility, high on currents, and low off currents.

The present invention enables satisfying the above needs by using a polycycloolefinic polymer in the dielectric layer of an OE device which does not contain a polar or aromatic unit, is chemically inert, has an inherently low k, has a pendant group that imparts solubility and cross-linking functionality, and is selected from pendant olefinic chains wherein preferably the isomerization of the C—C double bond in the olefinic chain can be controlled.

SUMMARY

The present invention relates to an OE device comprising a dielectric layer, said dielectric layer comprising, or being obtained through the use of, a polycycloolefinic polymer comprising one or more pendant olefinic groups, preferably selected from $C_3$ to $C_{20}$ alkenyl groups.

The invention further relates to the polycycloolefinic polymer comprising one or more pendant olefinic groups where the pendant olefinic groups feature controlled isomerization levels of the terminal/internal olefinic groups thus providing desirable and well controlled adhesion properties.

The invention further relates to a dielectric layer in an OE device, said dielectric layer comprising, or being obtained through the use of, a polycycloolefinic polymer comprising one or more pendant olefinic groups.

Some embodiments in accordance with the present invention encompass a process of preparing a dielectric layer in an OE device through the use of a polycycloolefinic polymer comprising one or more pendant olefinic groups.

The aforementioned OE devices are, for example, Organic Field Effect Transistors (OFET), including Organic Thin Film Transistors (OTFT), Organic Light Emitting Diodes (OLED), Organic Photodetectors (OPD) or Organic Photovoltaic (OPV) devices. With regard to OFETs, such devices are inclusive of both top gate and bottom gate OFETs.

Embodiments of the present invention are also inclusive of products or assemblies encompassing an OE device as described above and below. Such products or assemblies being Integrated Circuits (IC), Radio Frequency Identification (RFID) tags, security markings or security devices containing an RFID tag, Flat Panel Displays (FPD), backplanes of FPDs, backlights of FPDs, electrophotographic devices, electrophotographic recording devices, organic memory devices, pressure sensors, optical sensors, chemical sensors, biosensors or biochips.

BRIEF DESCRIPTION OF THE DRAWINGS

Embodiments of the invention are described below with reference to the following drawings.

DETAILED DESCRIPTION

Figure 1:
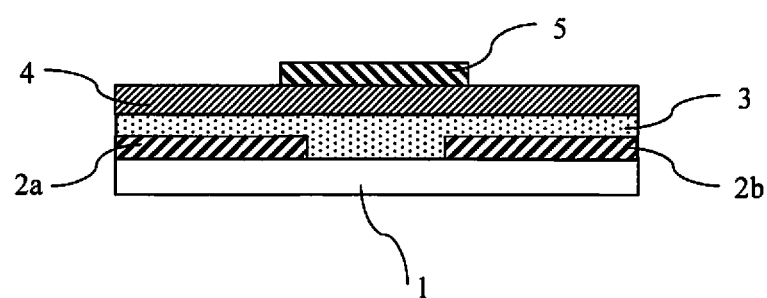
FIG. 1 is a schematic representation of a top gate OFET device embodiment in accordance with the present invention.

As used herein, the term Organic Field Effect Transistors (OFET) will be understood to be inclusive of the subclass of such devices known as Organic Thin Film Transistors (OTFTs).

In addition, it will be understood that the terms "dielectric" and "insulating" are used interchangeably herein. Thus reference to an insulating material or layer is inclusive of a dielectric material or layer. Further, as used herein, the term "organic electronic device" will be understood to be inclusive of the term "organic semiconductor device" and the several specific implementations of such devices, such as the OFETs, are as defined above.

As used herein, the terms "orthogonal" and "orthogonality" will be understood to mean chemical orthogonality. For example, an orthogonal solvent means a solvent which, when used in the deposition of a layer of a material dissolved therein on a previously deposited layer, does not dissolve said previously deposited layer.

As used herein, the term "polymer" will be understood to mean a molecule that encompasses a backbone of one or more distinct types of repeating units (the smallest constitutional unit of the molecule) and is inclusive of the commonly known terms "oligomer", "copolymer", "homopolymer" and the like. Further, it will be understood that the term polymer is inclusive of, in addition to the polymer itself, small amounts of residues from initiators, catalysts and other elements attendant to the synthesis of such a polymer, where such residues are understood as not being covalently incorporated thereto. Further, while such residues, and other elements, are generally removed during post polymerization purification processes, trace amounts of such materials can be found to be mixed or co-mingled with the polymer such that they generally remain with the polymer when it is transferred between vessels or between solvents or dispersion media.

As used herein, the term "small molecule" will be understood to mean a monomeric compound which typically does not carry a reactive group by which it can be reacted to form a polymer, and which is designated to be used in monomeric form. In contrast thereto, the term "monomer", unless stated otherwise, will be understood to mean a monomeric compound that carries one or more reactive functional groups by which it can be reacted to form an oligomer or a polymer.

As used herein, the term "organic semiconductor (OSC) composition", also shortly referred to as "composition", means at least one organic semiconductor (OSC) compound and one or more other materials added to the at least one OSC compound to provide, or to modify, specific properties of the OSC composition and/or of the at least one OSC compound therein. It will be understood that an OSC composition is also a vehicle for carrying the OSC to a substrate to enable the forming of layers or structures thereon. Exemplary materials include, but are not limited to, solvents, volatile surfactants and adhesion promoters.

As defined herein, the terms "polycycloolefin", "polycyclic olefin", and "norbornene-type" are used interchangeably and refer to addition polymerizable monomers, or the resulting repeating unit, encompassing at least one norbornene moiety such as shown by either Structure A1 or A2, below. The simplest norbornene-type or polycyclic olefin monomer bicyclo[2.2.1]hept-2-ene (A1) is commonly referred to as norbornene.

(A1)

(A2)

However, the term "norbornene-type repeating unit" or "norbornene-type monomer", as used herein, is understood to not only mean norbornene itself but also to refer to any substituted norbornene, or substituted and unsubstituted higher cyclic derivatives thereof, for example of Structures B1 or B2, respectively shown below, wherein m is an integer of zero or greater, where m=zero being the norbornene monomer of formula A1 or its respective repeat unit of formula A2.

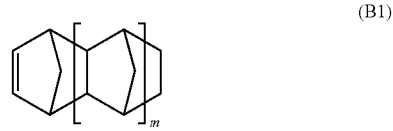

(B1)

(B2)

As will be discussed hereinafter, the use of a substituted norbornene-type monomer to form polymer embodiments of the present invention allows for the properties of such embodiments to be tailored to fulfill the needs of individual applications. The procedures and methods that have been developed to polymerize norbornene-type monomers having a variety of functional substituents, such as those described below, exhibit an outstanding flexibility and tolerance to various moieties and groups of the monomers. In addition to polymerization of monomers with a specific pendant group, monomers having a variety of distinct functionalities can be randomly polymerized to form a final material where the types and ratios of monomers used dictate the overall bulk properties of the resulting polymer.

Some preferred embodiments of the present invention encompass an OE device comprising a dielectric layer, said dielectric layer essentially consisting of a polycycloolefinic polymer comprising one or more pendant olefinic groups, preferably selected from $C_3$ to $C_{20}$ alkenyl groups.

Further preferred embodiments of the present invention encompass a polycycloolefinic polymer comprising one or more pendant olefin groups that is used for preparing a dielectric layer in an OE device. The pendant olefin groups can be cross-linked in a cross-linking reaction, preferably initiated by a cross-linking agent, like for example a diazide cross-linker that initiates the reaction.

In some preferred embodiments of the present invention the polycycloolefinic polymer is soluble in non-fluorinated solvents, preferably in inert solvents, and is deposited from a solution in an inert, non-fluorinated solvent or solvent composition. The solvent or solvent composition provides good orthogonality to an underlying OSC layer and renders the polycycloolefinic polymer especially suitable for use as dielectric layer in a top gate OFET device.

It has been found that during the synthesis of the polycycloolefinic polymer containing pendant olefinic groups, isomerization may occur to produce a mixture of terminal and isomerized forms. This invention also relates to the influence on OE device performance of a polycycloolefinic polymer containing such a pendant olefinic group, but in which the isomerization is controlled to give a material containing a majority of the terminal olefin, and another containing a majority of the internal isomer form. This aspect is further discussed in detail below.

The polycycloolefinic polymer, which is used in the dielectric layer, is preferably selected from norbornene-type polymers.

In some preferred polymer embodiments in accordance with the invention, the norbornene-type polymers incorporate two or more distinct types of repeating units.

Other preferred polymer embodiments in accordance with the invention encompass one or more norbornene-type polymers having one or more distinct types of repeating units of Formula I

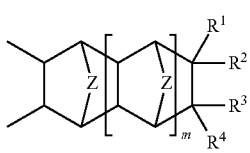

(I)

wherein Z is selected from —$CH_2$—, —$CH_2$—$CH_2$— or —O—, m is an integer from 0 to 5, each of $R^1$, $R^2$, $R^3$ and $R^4$ independently denote H or a $C_3$ to $C_{20}$ alkenyl group, and wherein one or more of $R^{1-4}$ denote a $C_3$ to $C_{20}$ alkenyl group.

The repeating units of Formula I are formed from the corresponding norbornene-type monomers of Formula Ia where Z, m and $R^{1-4}$ are as defined above:

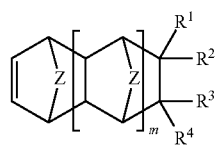

(Ia)

Some preferred polymer embodiments in accordance with the present invention encompass repeating units of Formula I and monomers of Formula Ia, where Z is —$CH_2$— and m is 0, 1 or 2. For other such embodiments Z is —$CH_2$— and m is 0 or 1, and for still other embodiments Z is —$CH_2$— and m is 0.

Other preferred polymer embodiments of the present invention encompass repeating units of Formula I and monomers of Formula Ia where only one of $R^{1-4}$, for example $R^1$, is different from H, and the others of $R^{1-4}$ are H.

Other preferred polymer embodiments of the present invention encompass repeating units of Formula I and monomers of Formula Ia where those of $R^{1-4}$ that are different from H denote a $C_3$ to $C_{12}$ alkenyl group, very preferably a $C_4$ to $C_{10}$ alkenyl group, most preferably a butenyl or hexenyl group.

The polymer embodiments of the present invention can advantageously be tailored to provide a distinct set of properties for each of many specific applications. For example, varying the length of an alkenyl pendant group can allow control of the polymer's modulus and glass transition temperature ($T_g$).

Preferred exemplary repeating units that encompass a pendant reactive group with an olefinic portion, and that are representative of Formula I, are formed during polymerization from norbornene-type monomers that include, but are not limited to, those selected from formula M

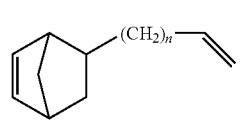

M where n is an integer from 0 to 8. Preferred examples of norbornene-type monomers of formula M are the monomers of subformula M4 ("butenylNB") and M6 ("hexenylNB"). Very preferred is the monomer of subformula M4.

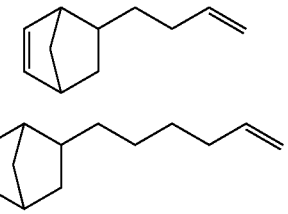

M4

M6

During polymerization of the norbornene-type monomers, at least a part of the pendant olefinic portion can undergo isomerization, as a result of which the pendant C═C double bond may be shifted from a terminal position to a non-terminal position in the olefinic chain. Thus, the norbornene-type polymer can encompass both repeating units with an isomerized olefinic group and repeating units with a non-isomerized olefinic group.

Preferred exemplary repeating units that encompass a pendant reactive group with an olefinic portion, and that are representative of Formula I, are those of formula P (before or after isomerization) and formula Pi (after isomerization).

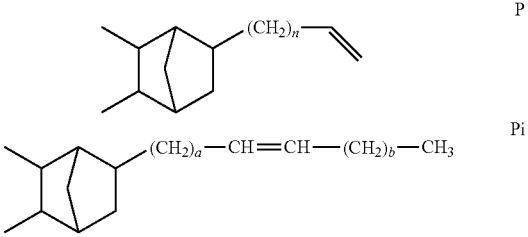

P

Pi where n is an integer from 0 to 8, a and b are independently of each other an integer from 0 to 7, and wherein a+b≤7.

Preferred examples of norbornene-type repeating units of formulae PA and PB are selected of the following subformulae

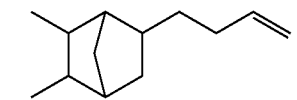 P4

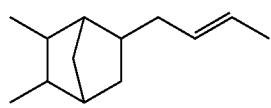 P4i1

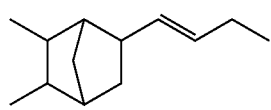 P4i2

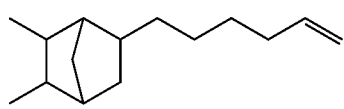 P6

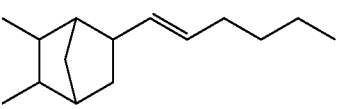 P6i1

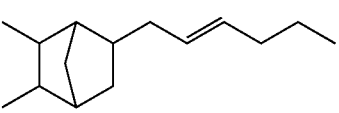 P6i2

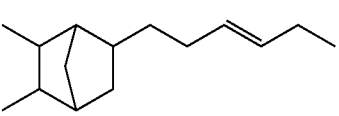 P6i3

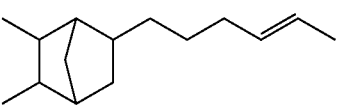 P6i4

Very preferred are repeating units of formula P4 and P4i1.

The norbornene-type polymer can encompass a repeating unit of formula P or its subformulae and one or more repeating units of formula Pi or its subformulae.

Thus, another preferred embodiment relates to a polycycloolefinic polymer which is a copolymer comprising two or more repeating units, each repeating unit comprising a different isomeric form of the same pendant alkenyl group.

The polycycloolefinic polymer of this preferred embodiment is preferably selected of Formula II

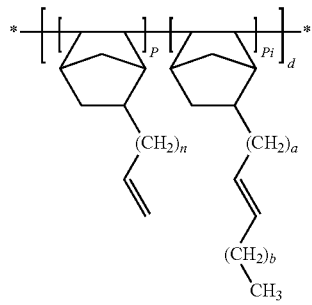 (II)

wherein n is an integer from 0 to 8, a and b are independently of each other an integer from 0 to 7, and wherein a+b≤7, d is an integer >1, P is the molar ratio of units P with a terminal pendant alkenyl group, and Pi is the molar ratio of units Pi with an isomerized pendant alkenyl group, and P is >0 and <1 and Pi is >0 and <1.

Especially preferred are polycycloolefinic polymers of formula II wherein n is 2 and a+b=1, in particular wherein a is 1 and b is 0.

Further preferred are polycycloolefinic polymers comprising, preferably consisting of, units P with a terminal pendant alkenyl group and units Pi with an isomerized pendant alkenyl group, wherein the ratio of units P to units Pi is from 1:6 to 20:1, preferably from 1:4 to 14:1, very preferably from 1:3 to 12:1.

Further preferred are polycycloolefinic polymers of formula IIa

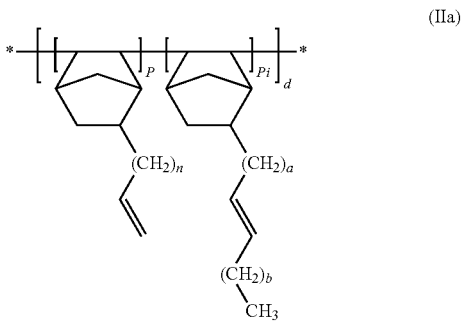 (IIa)

wherein d, n, a and b are as defined in Formula II, and the ratio of units P with a terminal pendant alkenyl group to units Pi with an isomerized pendant alkenyl group is from 1:6 to 20:1, preferably from 1:4 to 14:1, very preferably from 1:3 to 12:1.

Unless stated otherwise the value of the ratio of terminal to isomerized pendant alkenyl groups in the polycycloolefinic polymer is determined by integration of the olefinic region in the $^1$H NMR spectrum.

While Formula I and Ia, as well as each of the subformulae and generic formulae provided above are depicted without indication of any stereochemistry, it should be noted that generally each of the monomers, unless indicated otherwise, are obtained as diastereomeric mixtures that retain their configuration when converted into repeating units. As the exo- and endo-isomers of such diastereomeric mixtures can have slightly different properties, it should be further understood that preferred embodiments of the present invention are made to take advantage of such differences by using monomers that are either a mixture of isomers that is rich in either the exo- or endo-isomer, or are essentially the pure advantageous isomer.

Accordingly, in some embodiments of this invention encompass a method of controlling the isomerization of terminal double bond in a polycycloolefinic polymer encompassing:

subjecting a polycycloolefinic polymer encompassing an initial repeat unit of formula P:

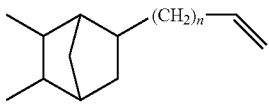

to sufficient length of time in a suitable reaction solvent at a temperature range of 60° C. to 100° C. so as to form the isomerized repeat unit of formula Pi:

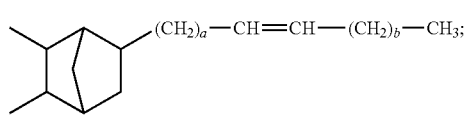

and isolating the resulting polycycloolefinic polymer of formula (IIa):

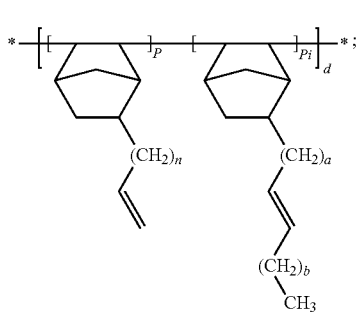

where d, n, a, b, P and Pi are as defined herein.

In general, the polymerization of a norbornene-type monomer of formula M is subjected to a polymerization condition as described hereinabove and hereinbelow to form a polycycloolefinic polymer encompassing an initial repeat unit of formula P. Such polymerizations are carried out suitably in the presence of a catalyst/co-catalyst in a solvent. Various Group VIII transition metal catalysts can be employed for such polymerization reactions including palladium catalysts, such as for example, [(allyl)palladium (trinaphthylphosphine)(trifluoroacetate)] in the presence of a variety of co-catalysts including, for example, lithium tetra (pentafluorophenyl)borate etherate, LiFABA ([Li(Et$_2$O)$_{2.5}$][B(C$_6$F$_5$)$_4$]. The polymerization is generally carried out in the presence of a hydrocarbon solvent, such as for example, toluene, as further discussed in detail below. Then the resulting polycycloolefinic polymer of formula P is allowed to isomerize to form a polymer having the repeat units of formula Pi for a sufficient length of time, for example, for a period of 4 hours to 100 hours. In some embodiments the reaction time for the isomerization is preferably from 8 hours to 60 hours, and very preferably from 18 hours to 40 hours. It should however be noted that the time required for achieving the desired degree of isomerization depends on several factors including the type of initial repeat unit of formula P in the polymer, the type of catalyst and the reaction temperature employed, among other factors. This aspect becomes more apparent from the specific examples that follows in which it is shown that certain of the repeat units of formula P may isomerize rapidly within minutes to a repeat unit of formula Pi with a pendant internal olefinic group, whereas some other repeat units of formula P may take several hours to isomerize. Accordingly, all such variations are part of this invention. In general, the reaction temperature during isomerization is maintained at a fixed temperature from 60° C. to 100° C., preferably from 70° C. to 90° C. and very preferably from 75° C. to 85° C.

In some preferred embodiments of the present invention a composition encompasses a polycycloolefinic polymer of formula (IIa):

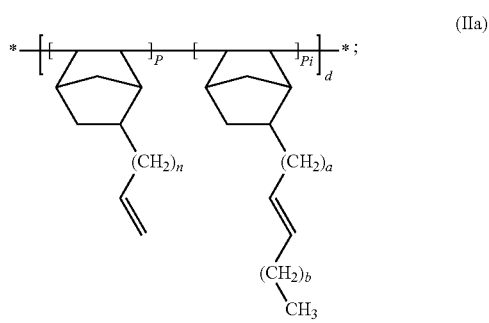

where d, n, a, b, P and Pi are as defined herein; a photoactive cross-linker; and a carrier solvent.

A photoactive cross-linker as defined herein is a material that is upon exposure to certain dose of radiation at certain wavelength undergoes a chemical reaction such that the reactive photo product formed therefrom causes the cross-linking of the polymer matrix contained therein. Any of the known photoactive cross-linkers which brings about such a change as described herein can be used in the composition of this invention. A few such exemplary photoactive cross-linkers include without any limitation, bisazide compounds, and the like.

Examples of such bisazides are 4,4'-diazidochalcone, 2-6-bis(4'-azidobenzyl)4-methylcyclohexanone, 4,4'-diazidodiphenylsulfone, 4,4'diazidobenzophenone, 4,4'-diazidobiphenyl, 2,2'-diazidostilbene, 4,4'-diazido-3,3'-dimethylbiphenyl, 2,7-diazidofluorene, 4,4'-diazidodiphenylmethane, 2,6-di-(p-azidobenzyl)-4-tert.amylcyclohexanone, 4,4'-diazidochalcon-2-[N,N-di-(2-ethoxyethyl)sulfonamide], 4,4'-diazidostilbene-2,2'-[N,N-di-(2-ethoxyethyl)sulfonamide], and 2,6-di-(p-azidobenzyl)-4-ethyl cyclohexanone. One or more of the foregoing photoactive cross-linkers can be employed.

In some embodiments of the composition of this invention the photoactive cross-linker employed is (2E,6E)-2,6-bis(4-azidobenzylidene)-4-ethylcyclohexanone, which is also known as BAC-E of the formula

BAC-E

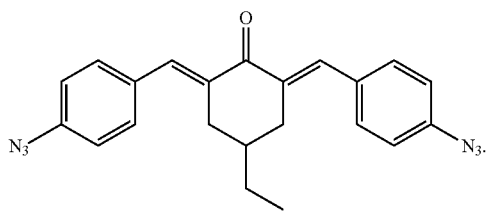

Any of the solvents suitable for dissolving the polymer of formula (IIa) can be used as a carrier solvent along with a solvent that would also dissolve the photoactive cross-linker. Some of such suitable solvents are listed hereinbelow. In some embodiments the polymer of formula (IIa) is dissolved in hydrocarbon solvents, such as, decane and the photoactive cross-linkers are dissolved in ester solvents, such as, benzyl acetate.

In some preferred embodiments the composition of this invention encompasses the following polymers:
poly(butenylnorbornene); and
poly(hexenylnorbornene).

Examples of suitable norbornene monomers, polymers and methods for their synthesis are provided herein and can also be found in pertinent parts of U.S. Pat. No. 6,455,650, US 2011/0104614 A1, US 2007/0066775 A1, US 2008/0194740 A1, US 2012/0056249 A1, US 2012/0056183 A1 and PCT/EP2013/002671, pertinent parts of which are incorporated into this application by reference. For example, exemplary polymerizations processes employing Group VIII transition metal catalysts are also described in a few of the aforementioned references and are further described hereinbelow.

The polymer embodiments of the present invention are formed having a weight average molecular weight ($M_w$) that is appropriate to their use. Generally, a $M_w$ from 5,000 to 500,000 is found appropriate for some embodiments, while for other embodiments other $M_w$ ranges can be advantageous. For example, in some preferred embodiments, the polymer has a $M_w$ of at least 10,000, while in other preferred embodiments the polymer has a $M_w$ of at least 20,000. In other preferred embodiments, the upper limit of the polymer's $M_w$ can be up to 400,000, while in other preferred embodiments the upper limit of the polymer's $M_w$ can be up to 250,000. It will be understood that since an appropriate $M_w$ is a function of the desired physical properties in the cured polymer, films, layers or structures derived therefrom, it is a design choice and thus any $M_w$ within the ranges provided above is within the scope of the present invention. In the polymers of the present invention, the total number of repeating units d is preferably from 2 to 10,000. The total number of repeating units d is preferably ≥5, very preferably ≥10, most preferably ≥50, and preferably ≤500, very preferably ≤1,000, most preferably ≤2,000, including any combination of the aforementioned lower and upper limits of d.

Other preferred embodiments in accordance with the present invention relate to a composition encompassing the polycycloolefinic polymer and a casting or printing solvent as already described hereinabove and hereinbelow.

In some preferred composition embodiments in accordance with the present invention the solvent is selected from organic solvents as described hereinbelow and hereinabove. In other embodiments the solvent includes, without limitation, cyclohexylbenzene, mesitylene, indan, xylene, tetralin, diethylbenzene, cyclopentanone, benzyl acetate or combinations of the aforementioned.

In other preferred composition embodiments in accordance with the present invention the concentration of the polycycloolefinic polymer in the composition is from 0.1% to 20%, preferably from 0.5% to 10%, and very preferably from 1% to 5%.

The aforementioned concentration values refer to the composition encompassing the solvent(s) and all solid components such as the polycycloolefinic polymer.

In some preferred composition embodiments in accordance with the present invention the OSC can be an n- or p-type OSC. Effective OSCs exhibit a FET mobility of greater than $1 \times 10^{-5}$ cm$^2$V$^{-1}$s$^{-1}$.

The OSC material employed for device embodiments in accordance with the present invention can be any conjugated molecule, for example, an aromatic molecule containing two or more, more specifically at least three aromatic rings. In some preferred OSC embodiments of the present invention, the OSC contains aromatic rings selected from 5-, 6- or 7-membered aromatic rings, while in other preferred embodiments the OSC contains aromatic rings selected from 5- or 6-membered aromatic rings. The OSC material can be a monomer, oligomer or polymer, including mixtures, dispersions and blends of one or more of monomers, oligomers or polymers.

Each of the aromatic rings of the OSC optionally contains one or more hetero atoms selected from Se, Te, P, Si, B, As, N, O or S, generally from N, O or S. Further, the aromatic rings can be optionally substituted with fluoro, cyano, alkyl, alkoxy, polyalkoxy, thioalkyl, silyl, ethynylsilyl, optionally substituted secondary or tertiary alkylamine or arylamine, aryl or substituted aryl groups, wherein ethynylsilyl groups are represented by —C≡C—SiR'R"R'", and substituted secondary or tertiary alkylamine or arylamine are represented by —N(R')(R"), wherein R' and R" are each independently H, optionally fluorinated $C_{1-12}$ alkyl or optionally fluorinated $C_{6-10}$ aryl.

The aforementioned aromatic rings can be fused rings or linked with a conjugated linking group such as —C(T')=C(T")—, —C≡C—, —N(R"")—, —N=N—, (R"")=N—, —N=C(R'")—, where T' and T" each independently represent H, Cl, F, —C≡N or lower alkyl groups such as $C_{1-4}$ alkyl groups and R"" is as defined above.

In other preferred composition embodiments in accordance with the present invention, OSC materials that can be used include compounds, oligomers and derivatives of compounds selected from the group consisting of condensed aromatic hydrocarbons, such as, tetracene, chrysene, pentacene, pyrene, perylene, coronene, or soluble substituted and/or heterocylic derivatives of the aforementioned; oligomeric para substituted phenylenes such as p-quaterphenyl (p-4P), p-quinquephenyl (p-5P), p-sexiphenyl (p-6P) or soluble substituted derivatives of these; benzidine compounds; stilbene compounds; triazines; substituted metallo- or metal-free porphines, phthalocyanines, fluorophthalocyanines, naphthalocyanines or fluoronaphthalocyanines; $C_{60}$ and $C_{70}$ fullerenes; N,N'-dialkyl, substituted dialkyl, diaryl or substituted diaryl-1,4,5,8-naphthalene-tetracarboxylic diimide and fluoro derivatives; N,N'-dialkyl, substituted dialkyl, diaryl or substituted diaryl 3,4,9,10-perylenetetracarboxylic diimide; batho-phenanthroline; diphenoquinones; 1,3,4-oxadiazoles; 11,11,12,12-tetracyano-naptho-2,6-quinodimethane; α,α'-bis(dithieno[3,2-b2',3'-d]thiophene); 2,8-dialkyl, substituted dialkyl, diaryl or substituted diaryl anthradithiophene; 2,2'-bibenzo[1,2-b:4,5-b']dithiophene. Where a liquid deposition technique of the OSC is desired, compounds from the above list and derivatives thereof are limited to those that are soluble in an appropriate solvent or mixture of appropriate solvents.

In other preferred composition embodiments in accordance with the present invention, the OSC materials are substituted oligoacenes such as pentacene, tetracene or anthracene, or heterocyclic derivatives thereof, more specifically oligoacenes that are substituted with alkylsilylethynyl groups, such as, bis(trialkylsilylethynyl) oligoacenes or bis(trialkylsilylethynyl) heteroacenes, for example, optionally fluorinated bis(trialkylsilylethynyl) anthradithiophenes, as disclosed for example in U.S. Pat. No. 6,690,029, WO 2005/055248 A1 or U.S. Pat. No. 7,385,221.

Where appropriate and needed to adjust the rheological properties of the OSC composition, as described for example in WO 2005/055248 A1, some embodiments of the present invention employ OSC compositions that include one or more organic binders in addition to the polycycloolefinic polymer. In other embodiments the OSC composition does not include an organic binder in addition to the polycycloolefinic polymer.

Other preferred embodiments in accordance with the invention relate to an OSC layer that is obtained through the use of an OSC composition in accordance with the present invention.

Other preferred embodiments in accordance with the present invention relate to a process of preparing an OSC layer, encompassing depositing a OSC composition in accordance with the present invention onto a substrate and, in case the OSC composition encompasses a solvent, removing the solvent.

In some preferred OSC layer embodiments in accordance with the present invention, deposition and/or forming of the OSC layer are performed using solution processing techniques. For example, a composition of the OSC and the polycycloolefinic polymer, typically a solution encompassing one or more organic solvents, can be deposited or formed using preferred techniques that include, but are not limited to, dip coating, slot-die coating spin coating, ink jet printing, letter-press printing, screen printing, doctor blade coating, roller printing, reverse-roller printing, offset lithography printing, flexographic printing, web printing, spray coating, brush coating, or pad printing, followed by the evaporation of the solvent employed to form such a solution. For example, an OSC material, a bank structure material and an organic dielectric material can each be deposited or formed by spin coating, flexographic printing, and inkjet printing techniques in an order appropriate to the device being formed.

In other preferred OSC layer embodiments in accordance with the present invention the concentration of the polycycloolefinic polymer in the OSC layer after deposition and solvent removal is from 2.5 to 25%, more specifically from 10 to 15%.

Other preferred embodiments in accordance with the present invention relate to an OE device encompassing an OSC layer and a dielectric or passivation layer, wherein the OSC layer is obtained through the use of an OSC composition in accordance with the invention, and the dielectric or passivation layer is obtained by vapor deposition of a p-xylylene, thus forming a layer of poly(p-xylylene).

In some preferred OE device embodiments in accordance with the present invention the poly(p-xylylene) is Parylene C.

Suitable process conditions for the vapor deposition process of p-xylylene are known to the skilled person and are described in the literature, for example, in P. Kramer et al., *Journal of Polymer Science: Polymer Chemistry Edition*, Vol. 22 (1984), pp. 475-491.

In some preferred OE device embodiments in accordance with the present invention the OE device encompasses an OSC layer and a dielectric or passivation layer, wherein the OSC layer is obtained through the use of an OSC composition encompassing an OSC and a polycycloolefinic polymer having one or more reactive groups, and the dielectric or passivation layer is obtained by vapor deposition of a p-xylylene on the OSC layer, thus forming a layer of a poly(p-xylylene) on the OSC layer, and wherein the reactive groups of the polycycloolefinic polymer react with unsaturated groups of the p-xylylene at the interface between the OSC layer and the dielectric or passivation layer during vapor deposition of the p-xylylene, resulting in chemical bonding of the polycycloolefinic polymer of the OSC layer with the poly(p-xylylene) of the dielectric or passivation layer at the interface between the OSC layer and the dielectric or passivation layer.

Preferred OE device embodiments in accordance with the present invention include, without limitation, organic field effect transistors (OFETs), organic thin film transistors (OTFTs), which can be top gate or bottom gate transistors, Organic Light Emitting Diodes (OLED), Organic Photodetecting (OPD) Devices or Organic Photovoltaic (OPV) Devices.

Some preferred OE device embodiments in accordance with the present invention can be, for example, OFETs where the OSC is used as the active channel material, OPV devices where the OSC is used as charge carrier material, or organic rectifying diodes (ORDs) where the OSC is a layer element of such a diode. OSCs for such embodiments can be deposited by any of the previously discussed deposition methods, but as they are generally deposited or formed as blanket layers, solvent coated methods such as spray-, dip-, web- or spin-coating, or printing methods such as ink-jet printing, flexo printing or gravure printing, are typically employed to allow for ambient temperature processing.

In some preferred OE device embodiments the OE device is a bottom gate or top gate OFET encompassing a gate dielectric layer encompassing a polycycloolefinic polymer as described above and below.

In other preferred OE device embodiments the OE device is a bottom gate or top gate OFET encompassing a passivation layer encompassing a polycycloolefinic polymer as described above and below.

Other preferred embodiments in accordance with the present invention relate to a process of preparing an OE device encompassing a dielectric or passivation layer comprising a polycycloolefinic polymer as described above and below, said OE device further encompassing an OSC layer being obtained by solution deposition of an OSC material.

Other preferred embodiments of the present invention relate to a process of preparing an OE device, encompassing the following steps in an appropriate sequence:

a) depositing an OSC material, preferably from an organic solution, to form an OSC layer, b) depositing source and drain electrodes, c) depositing a gate electrode, b) depositing a polycycloolefinic polymer as described above and below, preferably from an organic solution, to form a dielectric layer.

Figure 2:
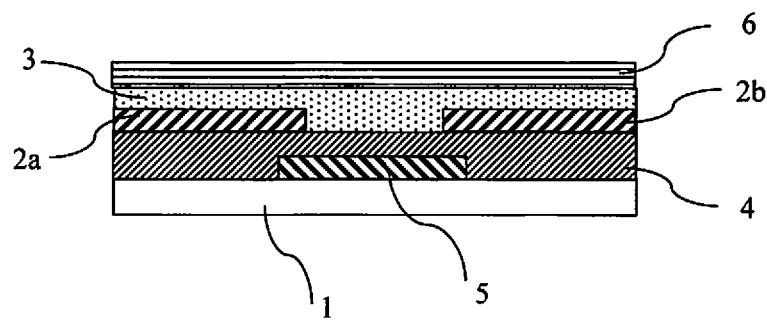
FIG. 2 is a schematic representation of a bottom gate OFET device embodiment in accordance with the present invention.

A top gate OFET in accordance with one preferred embodiment of the present invention is depicted schematically in FIG. 1, and a bottom gate OFET in accordance with another embodiment of the present invention is depicted schematically in FIG. 2.

Turning now to FIG. 1, a schematic and simplified representation of a top gate OFET device in accordance with a preferred embodiment of the present invention is provided. Such OFET device includes a substrate (1), source and drain electrodes (2a, 2b), an OSC layer (3), a dielectric layer (4) encompassing a polycycloolefinic polymer as described above and below and serving as gate insulator, and a gate electrode (5).

Other preferred embodiments in accordance with the present invention relate to a process for preparing a top gate OFET device, for example, as illustrated in FIG. 1, by a process encompassing:
a) forming source and drain electrodes (2a,2b) on a substrate (1),
b) forming an OSC layer (3) by deposition of an OSC material, preferably from an organic solution, on the source and drain electrodes (2a,2b),
c) forming a dielectric layer (4) by deposition of a polycycloolefinic polymer as described above and below, preferably from an organic solution, on the OSC layer (3),
d) forming a gate electrode (5) on the dielectric layer (4).

Turning now to FIG. 2, a schematic and simplified representation of a bottom gate OFET device in accordance with another preferred embodiment of the present invention is provided. Such OFET device includes a substrate (1), a gate electrode (5), a dielectric layer (4) comprising a polycycloolefinic polymer as described above and below serving as gate insulator, source and drain electrodes (2a, 2b), an OSC layer (3), and optionally a passivation layer (6).

Other preferred embodiments in accordance with the present invention relate to a process for preparing a bottom gate OFET device, for example, as illustrated in FIG. 2, by a process encompassing:
a) forming a gate electrode (5) on a substrate (1),
b) forming a dielectric layer (4) by deposition of a polycycloolefinic polymer as described above and below, preferably from an organic solution, on the substrate (1) and the gate electrode (5),
c) forming source and drain electrodes (2a, 2b) on the dielectric layer (4).
d) forming an OSC layer (3) by deposition of an OSC material, preferably from an organic solution, on the source and drain electrodes (2a, 2b) and the dielectric layer (4),
e) optionally forming a passivation layer (6) by deposition of a dielectric material on the OSC layer (3).

In the aforementioned processes, the electrodes (2a, 2b, 5) are for example applied onto the substrate (1) or the dielectric layer (4) by a sputtering process, and can be patterned by etching and/or lithographic patterning. The OSC layer (3) and dielectric layer (4) can be applied by a coating or printing process as described above.

The other components or functional layers of the OE and OFET devices, like the substrate and the gate, source and drain electrodes, can be selected from standard materials, and can be manufactured and applied to the device by standard methods. Suitable materials and manufacturing methods for these components and layers are known to a person skilled in the art and are described in the literature. Exemplary deposition methods include the liquid coating methods previously described as well as chemical vapor deposition (CVD) or physical vapor deposition methodologies.

The gate, source and drain electrodes in the OFET device embodiments in accordance with the present invention can be deposited or formed by liquid coating, such as spray-, dip-, web- or spin-coating, or by vacuum deposition methods including but not limited to physical vapor deposition (PVD), chemical vapor deposition (CVD) or thermal evaporation methods. Suitable electrode materials and deposition methods are known to the person skilled in the art. Suitable electrode materials include, without limitation, inorganic or organic materials, or composites of the two. Exemplary electrode materials include polyaniline, polypyrrole, poly(3, 4-ethylenedioxy-thiophene) (PEDOT) or doped conjugated polymers, further dispersions or pastes of graphite or particles of metal such as Au, Ag, Cu, Al, Ni or their mixtures as well as sputter coated or evaporated metals such as Cu, Cr, Pt/Pd, Ag, Au or metal oxides such as indium tin oxide (ITO) F-doped ITO or Al-doped ZnO. Organometallic precursors can also be used and deposited from a liquid phase.

Generally, the thickness of a functional layer, for example a gate dielectric or OSC layer, in some preferred OE and OFET device embodiments in accordance with the present invention is from 0.001 (in case of a monolayer) to 10 μm. In some other preferred embodiments such thickness ranges from 0.001 to 1 μm, and in still other preferred embodiments from 5 nm to 500 nm, although other thicknesses or ranges of thickness are contemplated and thus are within the scope of the present invention.

Various substrates may be used for the fabrication of the OE device embodiments of the present invention. For example, glass or polymeric materials are most often used. Suitable and preferred polymeric materials include, but are not limited to, alkyd resins, allyl esters, benzocyclobutenes, butadiene-styrene, cellulose, cellulose acetate, epoxide, epoxy polymers, ethylene-chlorotrifluoro ethylene copolymers, ethylene-tetra-fluoroethylene copolymers, fiber glass enhanced plastic, fluorocarbon polymers, hexafluoropropylene-vinylidene-fluoride copolymer, high density polyethylene, parylene, polyamide, polyimide, polyaramid, polydimethylsiloxane, polyethersulfone, poly-ethylene, polyethylenenaphthalate, polyethyleneterephthalate, polyketone, polymethylmethacrylate, polypropylene, polystyrene, polysulfone, polytetrafluoroethylene, polyurethanes, polyvinylchloride, polycycloolefin, silicone rubbers, and silicones, where polyethyleneterephthalate, polyimide, polycycloolefin and polyethylenenaphthalate materials have been found most appropriate. Additionally, for some preferred embodiments of the present invention the substrate can be any suitable material, for example, plastic, metal or glass material coated with one or more of the above listed materials. It will be understood that in forming such a substrate, methods, such as, extruding, stretching, rubbing or photochemical techniques can be employed to provide a homogeneous surface for device fabrication as well as to provide pre-alignment of an organic semiconductor material in order to enhance carrier mobility therein.

Unless the context clearly indicates otherwise, as used herein plural forms of the terms herein are to be construed as including the singular form and vice versa.

It will be appreciated that variations to the foregoing embodiments of the invention can be made while still falling within the scope of the invention. Each feature disclosed in this specification, unless stated otherwise, can be replaced by alternative features serving the same, equivalent or similar purpose. Thus, unless stated otherwise, each feature disclosed is one example only of a generic series of equivalent or similar features.

All of the features disclosed in this specification can be combined in any combination, except combinations where at least some of such features and/or steps are mutually exclusive. In particular, the features of the invention are applicable to all aspects of the invention and can be used in any combination. Likewise, features described in non-essential combinations can be used separately (not in combination).

The invention will now be described in more detail by reference to the following examples, which are illustrative only and do not limit the scope of the invention.

Above and below, unless stated otherwise percentages are percent by weight and temperatures are given in degrees Celsius (° C.). The values of the dielectric constant ∈ ("permittivity") refer to values taken at 20° C. and 1,000 Hz.

Example 1

The polycycloolefinic polymers described herein are prepared as follows.

(Poly(1-but-3-enylnorbornene-co-1-but-2-enylnorbornene) was prepared with varying ratio of the isomerized butenyl group:

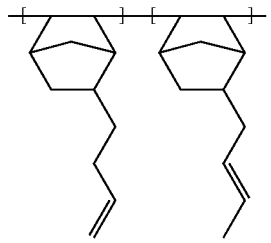

Polymer 1:

A solution of lithium tetra(pentafluorophenyl)borate etherate, LiFABA ([Li(Et$_2$O)$_{2.5}$][B(C$_6$F$_5$)$_4$], 47.4 mg, 0.054 mmol) and butenylnorbornene ("butenylNB", 20 g, 136 mmol) in toluene (total solution volume 50 mL) was heated to 80° C. Then a solution of [(allyl)palladium (trinaphthylphosphine) (trifluoroacetate)] (9.6 mg, 0.014 mmol, 0.01 M) in toluene was added to the reaction mixture. The reaction mixture stirred for 18 h at 80° C. The reaction mixture was allowed to cool to room temperature. The reaction mixture was diluted to 100 mL total volume with THF and was poured into MeOH (~10 fold excess). The precipitated polymer was filtered, then dried in a vacuum oven at 50° C. overnight to give a white powder. Yield: 19.4 g, 97%. GPC: $M_w$: 13,400, $M_w/M_n$: 3.35. The ratio of terminal to isomerized pendant butenyl groups associated with the butenylNB pendant group was determined by integration of the olefinic region in the $^1$H NMR spectrum and was found to be 1 to 3.3.

Polymer 2:

A solution of LiFABA ([Li(Et$_2$O)$_{2.5}$][B(C$_6$F$_5$)$_4$], 39.2 mg, 0.045 mmol) and butenylNB (22.1 g, 150 mmol) in toluene (total solution volume 55 mL) was heated to 70° C. Then a solution of [(allyl)palladium (trinaphthylphosphine)(trifluoroacetate)] (10.6 mg, 0.015 mmol, 0.004 M) in toluene was added to the reaction mixture. The reaction mixture stirred for 5 h at 70° C. The reaction mixture was allowed to cool to room temperature. Conversion was determined to be 98.4% (based on GC analysis). The reaction mixture was diluted to 275 mL total volume with toluene and was poured into isopropanol (~6 fold excess). The precipitated polymer was filtered, then dried in a vacuum oven at 50° C. overnight to give a white powder. GPC: $M_w$: 16,000, $M_w/M_n$: 2.81. The ratio of terminal to isomerized pendant butenyl groups associated with the butenylNB pendant group was determined by integration of the olefinic region in the $^1$H NMR spectrum and was found to be 12 to 1.

Polymer 3:

This example illustrates the effect of time on the rate of isomerization of the terminal bond to internal bond whereby the ratio of units P to units Pi in the final polymer changes from 60:1 to 1:5. A solution of LiFABA ([Li(Et$_2$O)$_{2.5}$][B(C$_6$F$_5$)$_4$], 11.8 mg, 0.014 mmol) and butenylNB (5 g, 34 mmol) in toluene (total solution volume 13 mL) was heated 70° C. Then a solution of [(allyl)palladium(trinaphthylphosphine) (trifluoroacetate)] (2.4 mg, 0.003 mmol, 0.003 M) in toluene was added to the reaction mixture. The reaction mixture stirred for 88 h at 70° C. with 7×1.5 mL aliquots taken at various time intervals (see Table 1). 0.5 mL of each aliquot was used for determination of conversion by total solids measurement and the remaining 1 mL of each aliquot was precipitated into 20 mL of acetone and the resulting solid was filtered and collected for GPC and NMR analysis. The ratio of terminal to isomerized pendant olefins associated with the butenylNB pendant group was determined by integration of the olefinic region of the $^1$H NMR spectrum and the results are summarized in Table 1. It is evident from these results that the isomerization of terminal olefinic bond to internal olefinic bond can be controlled and desired polymer of formula (IIa) can be readily formed depending upon the intended application.

TABLE 1

| reaction time (h) | % conversion | GPC $M_w$ | $M_w/M_n$ | Terminal to Isomerized |
|---|---|---|---|---|
| 0.5 | 55 | 22,300 | 2.30 | 60 to 1 |
| 1 | 73 | 19,800 | 2.61 | 35 to 1 |
| 2 | 93 | 17,700 | 2.99 | 20 to 1 |
| 3 | 100 | 17,100 | 3.35 | 15 to 1 |
| 4 | 100 | 17,200 | 3.61 | 5 to 1 |
| 24 | 100 | 18,300 | 3.84 | 1 to 3 |
| 88 | 100 | 18,800 | 4.01 | 1 to 5 |

Isomerization of 1-Hexene:

This example is provided to show ready isomerization of terminal olefin, such as 1-hexene under the conditions employed for the polymerization of alkenylnorbornene. A solution of LiFABA ([Li(Et$_2$O)$_{2.5}$][B(C$_6$F$_5$)$_4$], 36 mg, 0.041 mmol) and 1-hexene (4.8 g, 57 mmol) in toluene (total solution volume 111 mL) was heated to 80° C. Then a solution of [(allyl)palladium (trinaphthylphosphine) (trifluoroacetate)] (7 mg, 0.01 mmol, 0.01 M) in toluene was added to the reaction mixture. The reaction mixture stirred for 0.5 h at 80° C. and an aliquot was taken out and analysed by GC-MS to determine the ratio of terminal to isomerized olefins associated with the 1-hexene pendant group. The results are summarized in Table 2. It is evident from the data presented in Table 2, 1-hexene undergoes rapid isomerization to internal olefin.

TABLE 2

| Time (h) | Terminal to Isomerized |
|---|---|
| 0.5 | 1 to 950 |

Comparative Example

Polymer C1

A non-crosslinkable polymer, poly(hexylnorbornene) (pHexNB), which can be used to compare the effects of the pendant olefin addition was tested. pHexNB contains only a pendant hexyl chain, and hence possesses no crosslinking functionality. This polymer was prepared as follows. A solution of hexylnorbornene (161 g, 900 mmol), cyclohexane (823 ml) and ethyl acetate (364 ml) were added to a jacketed glass reactor, sparged with nitrogen for 30 minutes and cooled to 20° C. with stirring. Then a solution of (η⁶-toluene)nickel bis(pentafluorophenyl) (1.26 g, 2.6 mmol) in ethyl acetate was added to the reaction mixture. The reaction mixture stirred for 2 h at 20° C. The reaction mixture was warmed to room temperature. After residual catalyst removal the polymer was solvent exchanged into 2-heptanone forming an 18% w/w solution. Polymerization conversion is 100% (based on total solids analysis). GPC: Mw: 240,000, $M_w/M_n$: 2.

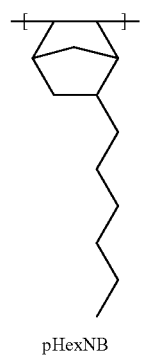

pHexNB

For comparison purpose, Polymer C2, which is the copolymer p(BuNB/DCPD) (77/23), was also investigated, in which there is only a single isomer of the double bond, most closely resembling the internal isomerised form.

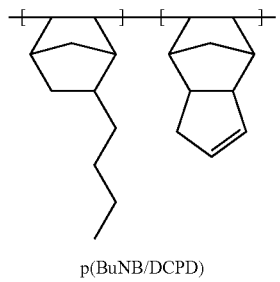

p(BuNB/DCPD)

As mentioned above it is important to retain the low-k nature of the polymers when introducing a crosslinking moiety. In this case there is only a small increase in k by 0.1 when the butenylNB is introduced in the place of hexylNB. The two isomerised forms show no difference in k value, as can be seen from Table 3.

TABLE 3

| | Polymer 1 (high isomerised) | Polymer 2 (high terminal) | Polymer C1 (pHexNB) | Polymer C2 p(BuNB/ DCPD) |
|---|---|---|---|---|
| k | 2.3 | 2.3 | 2.2 | 2.2 |

In order to facilitate crosslinking, the diazide crosslinker, BAC-E, as shown below is added at a concentration of 10% (10 pph) to Polymer 1, Polymer 2 and Polymer C2, respectively. The compositions were prepared as follows. Polymer 1 and Polymer 2 each (2 g) and BAC-E (0.2 g) were dissolved in the mixture of decane and cyclopentanone (wt 2:1, 7.8 g) by rolling each mixture. Polymer C2 (0.9 g) was dissolved in decane (9 g) by rolling. BAC-E (0.1 g) was dissolved in benzyl acetate (1 g). The BAC-E solution was added to the polymer solution and rolled to mix. All compositions were filtered through a 0.45 μm PTFE syringe filter.

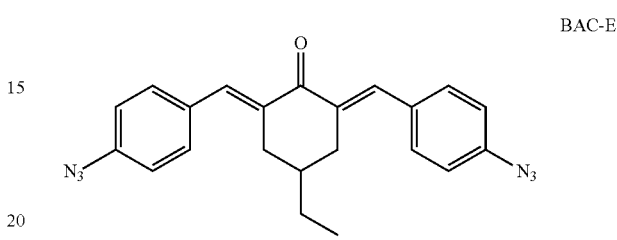

BAC-E

The dielectric permittivity (k value) of the polymers and compositions was determined as follows: The investigated polymer was deposited on cleaned (acetone followed by IPA) ITO-coated glass. The desired polymer thickness was in the range of 800 and 1200 nm. Metal dots (commonly, Ag or Au) were deposited by thermal evaporation through a shadow mask, forming a capacitor type device where the investigated polymer's k-value could be determined by measuring the capacitance of each device (two probes connected to each of the electrodes: ITO and metal) and relating the obtained value versus polymer's precise thickness. For reducing measurement errors the average value from measurement of several test devices is used.

The results are shown in Table 4 and demonstrate that the addition of the initiator increases the k value of the films, due to the polar nature of BAC-E. Additionally, upon UV irradiation BAC-E forms a reactive nitrene intermediate that reacts with the polymer to form an amine derivative, which alters the k-value of the cured film, as shown in Table 4.

TABLE 4

| | Polymer 1 | Polymer 2 | Polymer C1 (p(HexylNB)) (no BAC-E) | Polymer C2 p(BuNB/ DCPD) |
|---|---|---|---|---|
| K (before UV irradiation) | 2.4 | 2.4 | 2.2 | — |
| K (after UV irradiation) | 2.6 | 2.6 | 2.2 | 2.5 |

The effectiveness of crosslinking of the isomers Polymer 1 and Polymer 2 were evaluated using a simple solvent exposure puddle test in which the % thickness loss was measured after exposure to THF as a function of 365 nm UV dose. From these results it can be concluded that Polymer 2 with terminal isomer has improved crosslinking effectiveness compared to the internal isomer at identical curing conditions and BAC-E loading, as shown in Table 5.

TABLE 5

| UV dose (J/cm$^2$)@365 nm | Thickness loss; Polymer 1 (high isomerized pendant olefin content) | Thickness loss; Polymer 2 (high terminal pendant olefin content) |
| --- | --- | --- |
| 0.70 | 80% | 43% |
| 1.20 | 73% | 39% |
| 2.05 | 61% | 29% |
| 2.5 | 60% | 33% |
| 2.97 | 56% | 20% |

The above compositions were also tested for their imageability and performance of the so formed images based on the degree of isomerization of the units of formula P to the units of formula Pi. The imaging studies were carried out as follows. The compositions obtained from Polymer 1 and Polymer 2 with BAC-E were respectively poured onto a 4" SiO$_2$ wafer and spin coated using a headway spinner at 300 rpm for 40 secs. The films were soft baked at 120° C. for 2 min. The wafer was image-wise exposed at 365 nm using an ABM mask aligner with a 64 mJ/cm$^2$ dose at 365 nm. The exposed wafer was developed with decane on a spinner at 100 rpm for 15 secs with a 1000 rpm ramp. The wafers were dried by spinning at 2000 rpm for 30 secs. The imaging results are summarized in Table 6. The imaging examples are labelled in Table 6 as B1 and B2 for the images obtained from the respective compositions of Polymer 1 and Polymer 2. For comparative purposes a substantially identical composition was also formed from the Comparative Example, Polymer C1, poly(hexylnorbornene), which is designated as B3 in Table 6. It is evident from the data summarized in Table 6 that imaging Example B1, formed from Polymer 1, with higher isomerized pendant olefinic group exhibited better resolution. Whereas imaging Example B3, formed from Polymer C1, which has no cross-linkable group with BAC-E, exhibited no photoimageability and the film was mostly washed away. This is further manifested in lithographic photoimages obtained respectively for the compositions of Polymer 1 and Polymer 2. From these it is evident that the compositions of Polymer 1 exhibit better resolution of the photoimages in that the 5 μm contact holes are open. Whereas photoimages obtained with Polymer 2, the contact holes at 10 μm are open.

TABLE 6

| Imaging example | Mw | % Isomerization | Resolution |
| --- | --- | --- | --- |
| B1 | 13,400 | 77 | 5 μm contact holes open |
| B2 | 16,000 | 7 | 10 μm contact holes open |
| B3 | 240,000 | 0 | Film mostly washed away |

Example 2

To assess the OTFT performance of the materials they were used to construct standard top gate, bottom contact OFET devices, using the OSC polymer Lisicon® SP400 from Merck.

The dielectrics Polymer 1 and Polymer 2 were coated at 15% concentration from decane which provides orthogonality to the underlying OSC layer. For the trials below, the dielectrics were used without the addition of crosslinker, and spin coated 30 secs 900 rpm to give a film thickness of 0.5 μm. The film was baked at 100° C. for 2 minutes.

Polymer C1 (pHexylNB) was coated at 12.5% concentration from decane and spun at 10 secs 500 rpm then 1800 rpm 30 secs to give a 0.8 μm film. The film was baked at 100° C. for 2 minutes.

Polymer C2 [p(BuNB/DPCD)] was coated at 15% concentration from decane and spun at 3000 rpm for 30 secs to give a 0.65 μm film. No crosslinker was added. The film was baked at 100° C. for 2 minutes.

FIGS. 3, 4, 5 and 6 and Table 7 show the comparison of uncross-linked materials, formulated without addition of BAC-E in the dielectric stack.

Figure 3:
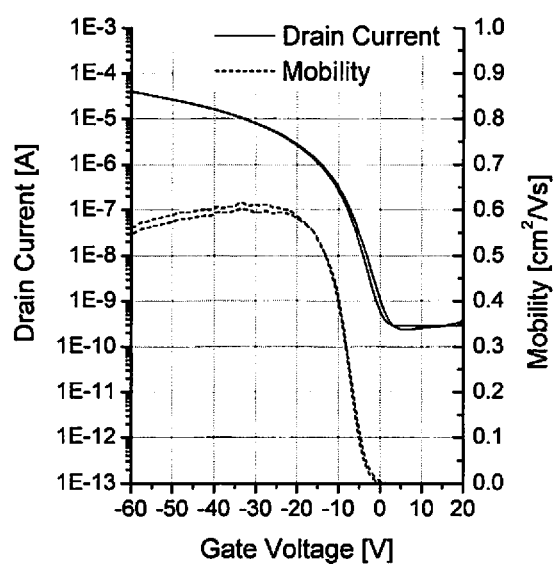
FIG. 3-6 are transfer curves of top gate OFET devices of Example 2.

FIG. 3 shows a device incorporating Polymer C1 (pHexylNB) dielectric with no crosslinkable functionality. This is therefore used as a reference and to illustrate changes in performance which occur in the substitution of alkyl to alkenyl in this experiment.

Figure 4:
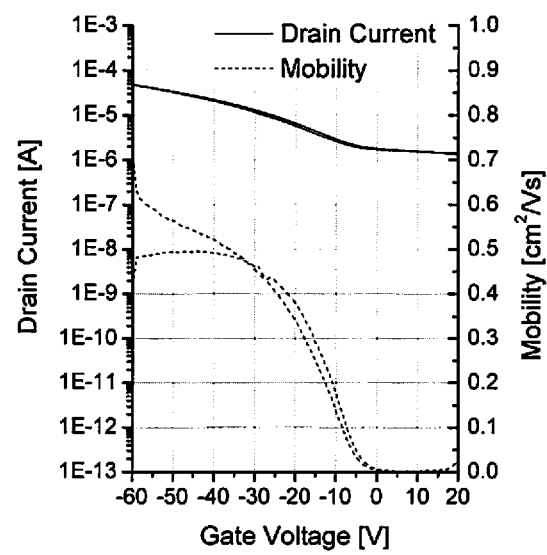
Figure 5:
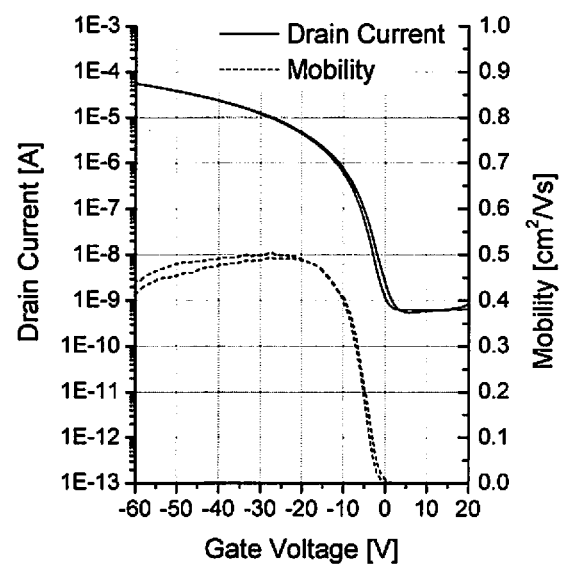

FIGS. 4 and 5 show devices made using Polymer 1 and Polymer 2 respectively. Comparing to the reference device in FIG. 3, the mobility is largely unaffected, however significant changes can be observed in the off currents of Polymer 1 (FIG. 4). This is illustrated further in Table 4.

Figure 6:
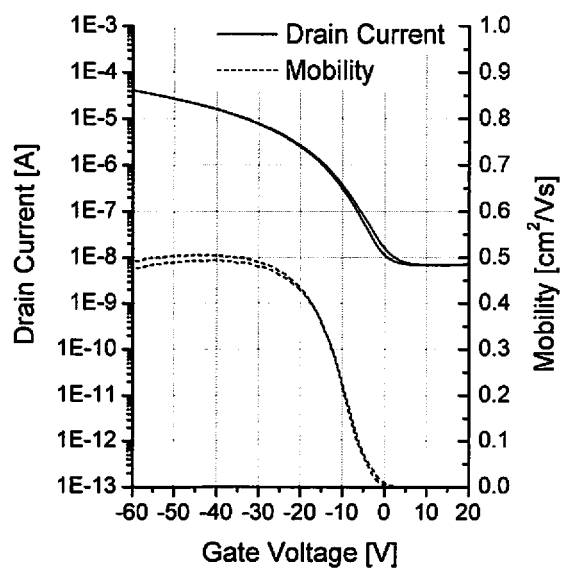

FIG. 6 shows a device made using Polymer C2 [p(BuNB/DPCD)]. The small percentage of the non-isomerizable double bond in this polymer, which can be considered analogous to the internal double bond in Polymer 1 shows a similar behaviour in the off current. The magnitude of this change is less due to the lower relative percentage of the internal double bond in Polymer C2 compared to Polymer 1.

TABLE 7

|  | Polymer C1 (pHexylNB) | Polymer 1 | Polymer 2 | Polymer C2 p(BuNB/DPCD) |
| --- | --- | --- | --- | --- |
| On current (A) | 10$^{-4}$ | 10$^{-4}$ | 10$^{-4}$ | 10$^{-4}$ |
| Off current (A) | 10$^{-9}$ | 10$^{-5}$ | 10$^{-9}$ | 10$^{-8}$ |

It can be seen that there is a strong influence of the isomer ratio on the off-current, and some effect of the DCPD on off current in Polymer C2 compared to the reference Polymer C1.

Example 3

OTFT devices were made including BAC-E and were crosslinked using a 365 nm UV dose of approximately 3 J/cm$^2$. When BAC-E was added it is expected to see a reduction in the hole mobility of the device, due to the k-dependence of this measurement.

The dielectrics Polymer 1 and Polymer 2 were coated at 20% concentration from a mixture of decane and cyclopentanone (2:1) which provides orthogonality to the underlying OSC layer, and also solubility for both the polymer and the BAC-E. The dielectrics were used with the addition of 10% BAC-E crosslinker, and spin coated 30 secs 3000 rpm to give a film thickness of 1.1 μm. The films were irradiated and baked at 100° C. for 2 minutes.

Polymer C1 (pHexylNB) was coated at 12.5% concentration from decane and spun at 10 secs 500 rpm then 1800 rpm 30 secs to give a 0.8 μm film. The film was baked at 100° C. for 2 minutes.

Polymer C2 [p(BuNB/DPCD)] was coated at 9% concentration from a mixture of decane and ethyl benzoate (80:20). The dielectrics were used with the addition of 10% BAC-E crosslinker and spun at 900 rpm for 30 secs to give a 0.90 μm film. The film was irradiated and baked at 100° C. for 2 minutes.

FIGS. 7, 8, 9 and 10 and Table 8 show the comparison of the materials in a dielectric stack.

Figure 7:
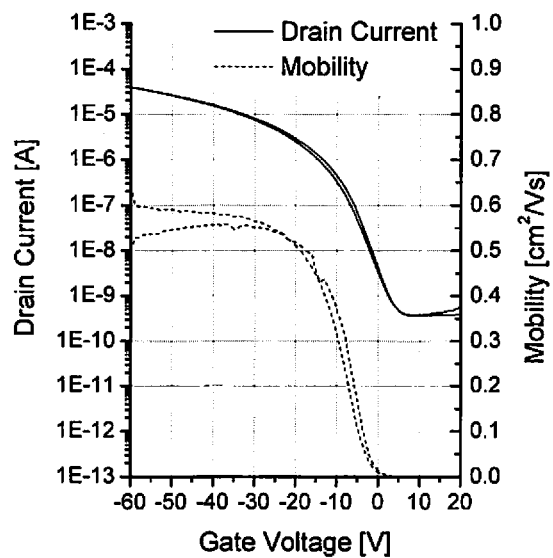
FIG. 7-10 are transfer curves of top gate OFET devices of Example 3.

FIG. 7 shows a device incorporating Polymer C1 as dielectric with no crosslinkable functionality and with no addition of BAC-E. This is therefore used as a reference and to illustrate changes in performance which occur upon crosslinking in this experiment.

Figure 8:
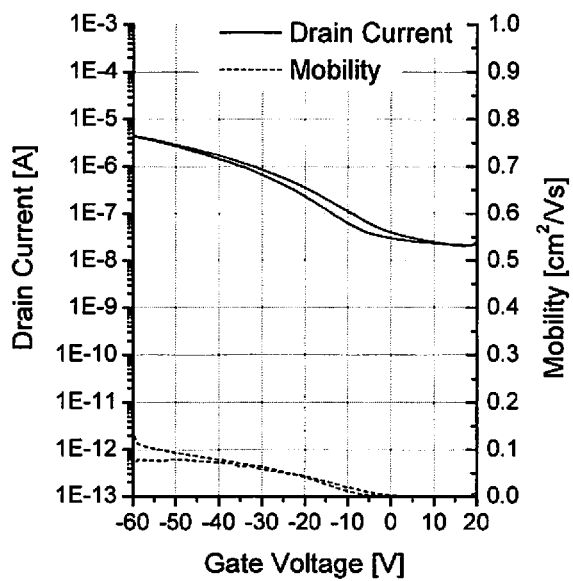
Figure 9:
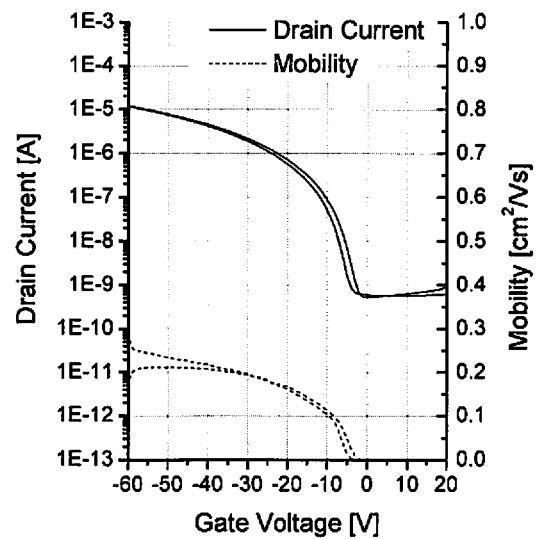

FIGS. 8 and 9 show devices made using Polymer 1 and Polymer 2 respectively. In both devices a significant drop in mobility is observed over the reference device. This can be attributed to increased dielectric permittivity (k value) measured for the BAC-E containing polymers. Comparing off currents, Polymer 2 shows little deviation from the reference, however Polymer 1 shows a significant change. This observation is consistent with Experiment 1 in which Polymer 1 exhibited higher off currents to both the reference and those made with polymer 2.

Figure 10:
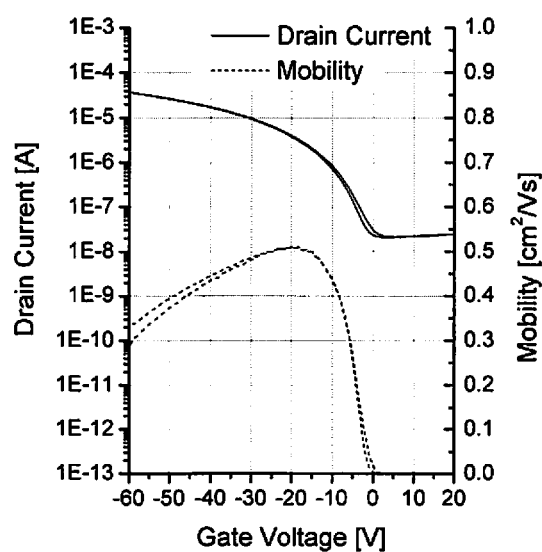

FIG. 10 shows a device made using Polymer C2 [p(BuNB/DCPD)], where a similar reduction in the off current can be observed due to the presence of the internal double bond. The mobility drop due to the inclusion of BAC-E is not as significant in this sample, consistent with the lower k value measured in Table 2.

TABLE 8

|  | Polymer C1 (pHexylNB) | Polymer 1 + BAC-E | Polymer 2 + BAC-E | Polymer C2 p(BuNB/ DCPD) + BAC-E |
|---|---|---|---|---|
| On current (A) | $10^{-4}$ | $10^{-5}$ | $10^{-4}$ | $10^{-4}$ |
| Off current (A) | $10^{-9}$ | $10^{-7}$ | $10^{-9}$ | $10^{-7}$ |

After crosslinking it can also be seen that although the mobility drops as a consequence of the higher k, the off current level when using Polymer 1 with the predominately internal isomer (i.e., repeat unit of formula Pi), remains high in contrast to Polymer C1 and Polymer 2 consisting predominantly of the terminal isomer (i.e, repeat unit of formula P). Polymer C2 shows some influence of the internal double bond in increasing the off current over reference Polymer C1.

The invention claimed is:

1. An organic electronic (OE) device comprising a dielectric layer, said dielectric layer comprising, or being obtained through the use of, a polycycloolefinic polymer comprising one or more repeating units selected from the following formulae:

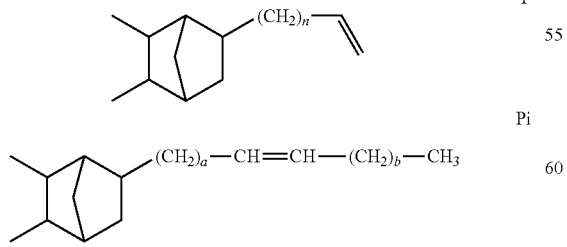

where n is an integer from 0 to 8, a and b are independently of each other an integer from 0 to 7, and wherein a+b≤7.

2. The OE device according to claim 1, wherein the polycycloolefinic polymer comprises one or more repeating units selected from the following formulae

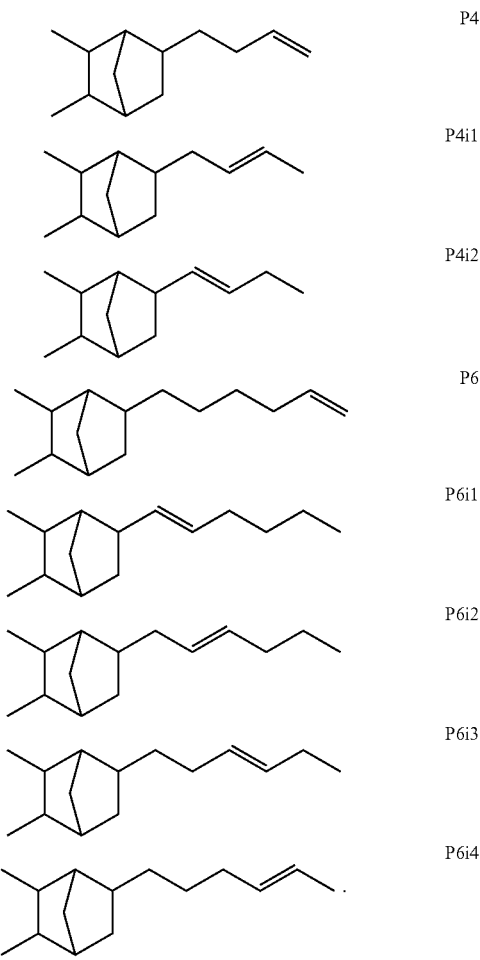

3. The OE device according to claim 1, wherein the polycycloolefinic polymer is a copolymer comprising two or more repeating units, each repeating unit comprising a different isomeric form of the same pendant alkenyl group.

4. The OE device according to claim 3, wherein the polycycloolefinic polymer is selected of Formula II

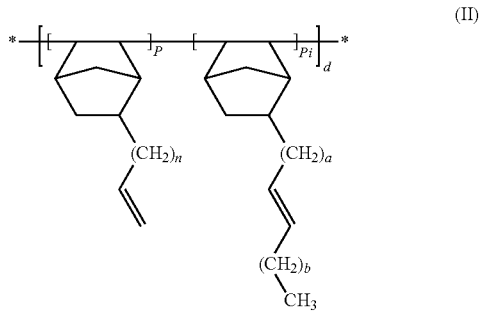

where n is an integer from 0 to 8, a and b are independently of each other an integer from 0 to 7, and wherein a+b≤7, d is an integer >1, P is the molar ratio of units P with a terminal pendant alkenyl group, and Pi is the molar ratio of units Pi with an isomerized pendant alkenyl group, and P is >0 and <1 and Pi is >0 and <1.

5. The OE device according to claim 1, wherein the polycycloolefinic polymer comprises units P with a terminal pendant alkenyl group and units Pi with an isomerized pendant alkenyl group, wherein the ratio of units P to units Pi is from 1:6 to 20:1.

6. The OE device according to claim 4, wherein the polycycloolefinic polymer is selected of formula IIa

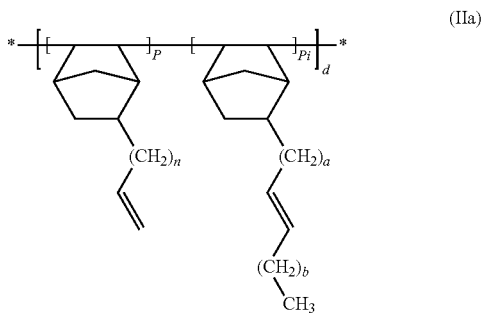

wherein the ratio of units P with a terminal pendant alkenyl group to units Pi with an isomerized pendant alkenyl group is from 1:6 to 20:1.

7. A dielectric layer in an OE device, said dielectric layer comprising, or being obtained through the use of, a polycycloolefinic polymer as defined in claim 1.

8. The OE device according to claim 1, which is an Organic Field Effect Transistor (OFET), Organic Thin Film Transistor (OTFT), Organic Light Emitting Diode (OLED) or Organic Photovoltaic (OPV) device or Organic Photodetector (OPD).

9. The OE device according to claim 8, which is a top gate OFET or bottom gate OFET.

10. The top gate OFET according to claim 9, which comprises a substrate (1), source and drain electrodes (2a, 2b), an organic semiconductor (OSC) layer (3), a dielectric layer (4) comprising a polycycloolefinic polymer as defined in one or more of claims 1 to 6 and serving as gate insulator, and gate electrode (5).

11. A process for preparing an OFET according to claim 10, which comprises:
A) forming source and drain electrodes (2a, 2b) on a substrate (1),
B) forming an OSC layer (3) by deposition of an OSC material on the source and drain electrodes (2a, 2b),
C) forming a dielectric layer (4) by deposition of a polycycloolefinic polymer as defined in one or more of claims 1 to 6 on the OSC layer (3),
D) forming a gate electrode (5) on the dielectric layer (4).

12. The bottom gate OFET according to claim 9, which comprises a substrate (1), a gate electrode (5), a dielectric layer (4) comprising a polycycloolefinic polymer as defined in one or more of claims 1 to 6 and serving as gate insulator, source and drain electrodes (2a, 2b), an OSC layer (3), and optionally a passivation layer (6).

13. A process for preparing an OFET according to claim 12, which comprises:
A) forming a gate electrode (5) on a substrate (1),
B) forming a dielectric layer (4) by deposition of a polycycloolefinic polymer as defined in one or more of claims 1 to 6 on the substrate (1) and the gate electrode (5),
C) forming source and drain electrodes (2a, 2b) on the dielectric layer (4),
D) forming an OSC layer (3) by deposition of an OSC material on the source and drain electrodes (2a, 2b) and the dielectric layer (4),
E) optionally forming a passivation layer (6) on the OSC layer (3).

14. A process according to claim 11, wherein the OSC material of the OSC layer (3) and the polycycloolefinic polymer of the dielectric layer (4) are deposited from an organic solution.

15. A product or assembly comprising an OE device according to claim 1, which is an Integrated Circuit (IC), a Radio Frequency Identification (RFID) tag, a security marking or security device containing an RFID tag, a Flat Panel Display (FPD), a backplane of an FPD, a backlight of an FPD, an electrophotographic device, an electrophotographic recording device, an organic memory device, a pressure sensor, an optical sensor, a chemical sensor, a biosensor or a biochip.

16. A method of controlling the isomerization of terminal double bond in a polycycloolefinic polymer comprising:
subjecting a polycycloolefinic polymer comprising an initial repeat unit of formula P:

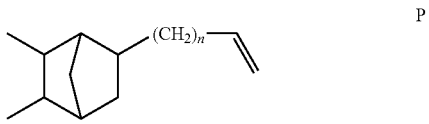

to sufficient length of time in a suitable reaction solvent at a temperature range of 60° C. to 80° C. so as to form the isomerized reheat unit of formula Pi:

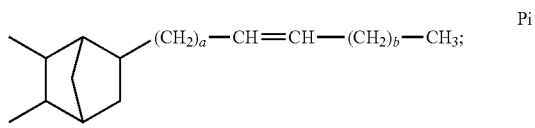

and
isolating the resulting polycycloolefinic polymer of formula (IIa):

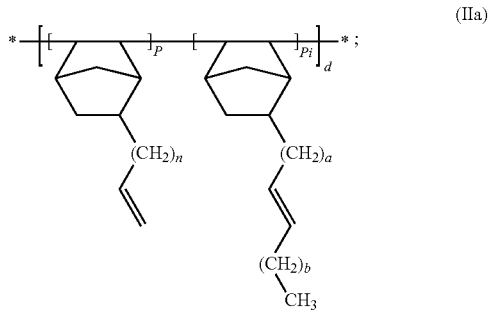

where n is an integer from 0 to 8, a and b are independently of each other an integer from 0 to 7, and wherein a+b≤7; d is an integer >1, and the ratio of units P with a terminal pendant alkenyl group to units Pi with an isomerized pendant alkenyl group is from 1:6 to 20:1.

17. A composition comprising:
a polycycloolefinic polymer of formula (IIa):

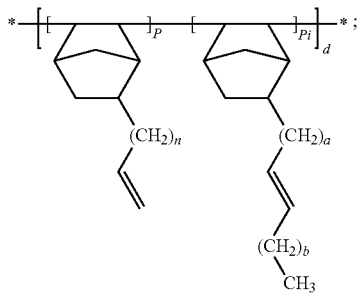

where n is an integer from 0 to 8, a and b are independently of each other an integer from 0 to 7, and wherein a+b≤7; d is an integer >1, and the ratio of units P with a terminal pendant alkenyl group to units Pi with an isomerized pendant alkenyl group is from 1:6 to 20:1;
a photoactive cross-linker; and
a carrier solvent.

18. A process according to claim 13, wherein the OSC material of the OSC layer (3) and the polycycloolefinic polymer of the dielectric layer (4) are deposited from an organic solution.

19. A product or assembly comprising an OE device according to claim 8, which is an Integrated Circuit (IC), a Radio Frequency Identification (RFID) tag, a security marking or security device containing an RFID tag, a Flat Panel Display (FPD), a backplane of an FPD, a backlight of an FPD, an electrophotographic device, an electrophotographic recording device, an organic memory device, a pressure sensor, an optical sensor, a chemical sensor, a biosensor or a biochip.

20. A product or assembly comprising an OE device according to claim 12, which is an Integrated Circuit (IC), a Radio Frequency Identification (RFID) tag, a security marking or security device containing an RFID tag, a Flat Panel Display (FPD), a backplane of an FPD, a backlight of an FPD, an electrophotographic device, an electrophotographic recording device, an organic memory device, a pressure sensor, an optical sensor, a chemical sensor, a biosensor or a biochip.

* * * * *